(12) United States Patent
Teng et al.

(10) Patent No.: US 10,060,029 B2
(45) Date of Patent: Aug. 28, 2018

(54) GRAPHENE MANUFACTURING METHOD

(71) Applicant: National Tsing Hua University, Hsinchu (TW)

(72) Inventors: Po-Yuan Teng, Hsinchu (TW); Po-Wen Chiu, Hsinchu (TW); Chun-Chieh Lu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 443 days.

(21) Appl. No.: 14/862,025

(22) Filed: Sep. 22, 2015

(65) Prior Publication Data
US 2016/0265105 A1 Sep. 15, 2016

Related U.S. Application Data

(62) Division of application No. 13/753,223, filed on Jan. 29, 2013, now abandoned.

(51) Int. Cl.
C23C 16/26 (2006.01)
C23C 16/44 (2006.01)
C23C 16/50 (2006.01)

(52) U.S. Cl.
CPC .............. *C23C 16/26* (2013.01); *C23C 16/44* (2013.01); *C23C 16/50* (2013.01)

(58) Field of Classification Search
CPC ............ C23C 16/26; C23C 16/50; H05H 1/24
See application file for complete search history.

(56) References Cited

U.S. PATENT DOCUMENTS

| 2002/0160111 A1* | 10/2002 | Sun | B82Y 10/00 427/248.1 |
|---|---|---|---|
| 2005/0202173 A1 | 9/2005 | Mills | |

(Continued)

FOREIGN PATENT DOCUMENTS

| CN | 102610398 A | 7/2012 |
|---|---|---|
| WO | 2012002666 A2 | 5/2012 |

OTHER PUBLICATIONS

Venkatachalam, Dinesh K., et al., "Rapid, substrate-independent thickness determination of large area graphene layers". Applied Physics Letters 99, 234106 (2011), pp. 1-3.*
Park, Sehkyu, et al., "Design of graphene sheets-supported Pt catalyst layer in PEM fuel cells". Electrochemistry Communications, 13 (2011) pp. 258-261.*
Astuti, Budi, et al., "Graphene as a Buffer Layer for Silicon Carbide-on-Insulator Structures". Materials 2012, 5, 2270-2279.*
Hofrichter, Jens, et al., "Synthesis of Graphene on Silicon Dioxide by a Solid Carbon Source". Nano Letters 2010, 10, 36-42.*
Ismach, Ariel, et al., "Direct Chemical Vapor Deposition of Graphene on Dielectric Surfaces". Nano Letters, 2010, 10, 1542-1548.*
Remote Catalyzation for Direct Formation of Graphene Layers on Oxides—Teng, Lu, Akiyama-Haswegawa, Lin, Yeh, Suenaga, Chid—ACS Publications, Nano Lett. 2012, 12, 1379-1384.

*Primary Examiner* — Bret P Chen
(74) *Attorney, Agent, or Firm* — Foster Pepper PLLC

(57) ABSTRACT

In some aspects, a method for manufacturing graphene applied to grow graphene layers on an insulated surface of a work piece, includes: preparing a work piece; preparing a catalyst having a gasiform transition metal element; preparing a carbon feedstock; preparing hydrogen; mixing the carbon feedstock, the hydrogen and the catalyst over the work piece, the flow rate of the catalyst is between 4 sccm and 1,200 sccm; and warming the carbon feedstock, the hydrogen and the catalyst to the temperature between 200 degrees and 1,200 degrees centigrade, and maintaining the pressure inside the chamber between 1 mTorr and 800 Torr to make the catalyst source react with the carbon feedstock and the hydrogen so as to catalyze the decomposition of carbon feedstock to generate a plurality of carbon atoms, and the plurality of carbon atoms form the graphene layers directly on the insulated substrates of the work piece.

12 Claims, 6 Drawing Sheets

(56) References Cited

U.S. PATENT DOCUMENTS

| | | | | |
|---|---|---|---|---|
| 2006/0083674 A1* | 4/2006 | Maruyama | ............... | B01J 23/88 423/447.3 |
| 2008/0214387 A1* | 9/2008 | Ostgard | ............... | B01J 31/0212 502/165 |
| 2009/0192030 A1* | 7/2009 | Myers | ...................... | B01J 23/89 502/184 |
| 2010/0320437 A1* | 12/2010 | Gordon | .................. | B82Y 10/00 257/9 |
| 2011/0244210 A1* | 10/2011 | Choi | ...................... | B82Y 30/00 428/220 |
| 2012/0196074 A1* | 8/2012 | Ago | ........................ | B82Y 30/00 428/64.1 |
| 2013/0266739 A1* | 10/2013 | Lin | ........................ | C23C 14/021 427/535 |
| 2014/0208523 A1* | 7/2014 | Kim | ...................... | D06F 39/008 8/137 |
| 2016/0221830 A1* | 8/2016 | Hayashi | .............. | C01B 31/0453 |

\* cited by examiner

GRAPHENE MANUFACTURING METHOD

CROSS-REFERENCE TO RELATED APPLICATION

This is a Divisional application of U.S. Ser. No. 13/753,223 filed Jan. 29, 2013, which is incorporated herein by reference. Ser. No. 13/753,223 claims priority to Taiwan Application No. 101128932 filed on Aug. 10, 2012 which is also incorporated herein by reference.

BACKGROUND OF THE INVENTION

1. Field of the Invention

The present invention relates to a graphene manufacturing system, and more particularly, to a method for manufacturing graphene by inputting gasiform catalyst from outside of a working chamber to react with a gasiform or solid carbon feedstock so as to form graphene layers on a surface of a work piece.

2. Description of the Prior Art

Graphene is a substance made of pure carbon, with atoms arranged in a regular hexagonal pattern similar to graphite, but in a one-atom thick sheet. It is an allotrope of carbon with structure being a single planar sheet of $sp^2$-bonded carbon atoms that are densely packed in a honeycomb crystal lattice. At present, graphene is the thinnest and most solid nanomaterial. Graphene is almost transparent and has good thermal conductivity. Besides, the electric resistivity of graphene is lower than copper and silver. According to the above advantages, graphene is expected to be used for developing new electronic components or transistors. Since graphene is exactly a transparent and good conductor, it is an appropriate substance to manufacture a touch screen, light board and even solar cells.

To generate graphene, X. Li et al. disclosed a method for using copper foils as a base, and providing the base with gasiform carbon feedstock at 1,000° C. to form graphene layers on a surface of the base. Then, the graphene layers can be transferred to a work piece. The transition metal element catalyzes the decomposition of carbon feedstock, but the graphene layers on the surface of a metal are not uniform because the catalytic effect of different metals is dissimilar. In the prior art, there will be residual metal on graphene when moving out the base. In addition, the consumption of copper foils in the prior art is too expensive, so the high cost is a bottleneck for graphene to be used in industry.

In view of the above, how to develop a process or system for generating uniform graphene without copper foils is an urgent problem.

SUMMARY OF THE INVENTION

One objective of the present invention is to provide a graphene manufacturing system for growing graphene layers on an insulated surface of a work piece, and the graphene manufacturing system comprises a furnace body, a catalyst source, a hydrogen source and a carbon feedstock source. The furnace body has a working chamber for holding the work piece. The catalyst source is configured in the outside of the furnace body and connected with the working chamber to provide the working chamber with gasiform catalyst comprising a transition metal element. The hydrogen source is connected with the working chamber to provide the working chamber with hydrogen. The carbon feedstock source is connected with the working chamber to provide the working chamber with gasiform carbon feedstock. The carbon feedstock source can also be configured in the furnace body, and carbon atoms can be released from a solid carbon feedstock. Wherein, in actual application, the catalyst source can react with the carbon feedstock and the hydrogen so as to catalyze the decomposition of the carbon feedstock for generating a plurality of carbon atoms, and the plurality of carbon atoms form the graphene layers directly on the insulated substrates of the work piece.

In addition, in actual application, the catalyst comprises a gasiform carrier and a catalytic particle solution. Furthermore, the catalyst source comprises an inlet end, an outlet end and a liquid container. The inlet end is connected with a gas source. The liquid container is configured between the inlet end and the outlet end for containing the catalytic particle solution. The outlet end is connected with the working chamber. In actual application, the gas source inputs the gasiform carrier through the inlet end for making the gasiform carrier pass through the liquid container so that the gasiform carrier can carry parts of the catalytic particle solution to form the catalyst, which is supplied to the working chamber through the outlet end. The above gasiform carrier is inert gas, and the above catalytic particle solution is a copper containing solution. To be more precise, the gasiform carrier is argon or helium.

The catalyst can be an aqueous solution, organic solution or powder of transition metal or transition metal compound, even gasified transition metal. The transition metal can be iron, cobalt, nickel, copper, zinc or iridium.

Additionally, the furnace body of the present invention can further comprise a warming device for warming the interior of the working chamber to a predetermined temperature, the predetermined temperature is between 200 degrees and 1,200 degrees centigrade or between 700 degrees and 1,200 degrees centigrade. Moreover, the furnace body can have a choice to further comprise a mixing chamber, which is configured among the catalyst source, the hydrogen source, the carbon feedstock source and the working chamber. The mixing chamber is used for mixing the carbon feedstock, the hydrogen and the catalyst before they enter the working chamber.

Another objective of the present invention is to provide a method for manufacturing graphene. The method is applied to grow graphene layers on a surface of a work piece. The above method comprises the following steps of: preparing a work piece, gasiform catalyst and gasiform carbon feedstock, wherein the gasiform catalyst is gasiform transition metal element; mixing the carbon feedstock, the hydrogen and the catalyst over the work piece, the flow rate of the catalyst is between 4 sccm and 1,200 sccm, the temperature is between 200 degrees and 1,200 degrees centigrade, the pressure inside the chamber is between 1 mTorr and 800 Torr. Then, the catalyst source reacts with the carbon feedstock and the hydrogen so as to catalyze the decomposition of carbon feedstock to generate a plurality of carbon atoms. The reaction time is about three minutes to eight hours. Finally, the plurality of carbon atoms forms the graphene layers directly on the insulated substrates of the work piece.

To be more precise, the step of preparing a catalyst further comprises the following substeps: preparing a catalytic particle solution and a gasiform carrier; making the gasiform carrier pass through the catalytic particle solution and carry parts of the catalytic particle solution to form the catalyst. Wherein, the gasiform carrier is inert gas, and the catalytic particle solution is a copper containing solution. Exactly, the gasiform carrier is argon or helium, the catalytic particle solution contains transition metals. The transition metals can be iron, cobalt, nickel, copper, zinc or iridium.

Importantly, the work piece of the above system and method is made of silica, quartz, sapphire, glass, NaCl, silicon nitride, alumina or the combinations thereof. Moreover, the work piece can have a plasma treatment. The plasma treatment is performed by plasma having oxygen or argon. To further improve the quality of the graphene layers, carbon seeds can be configured on a surface of the work piece.

The present invention is to provide a system and a method for manufacturing graphene. The present invention is different from the prior arts, using a metal foil as a catalyst. The present invention utilizes catalytic particles from the outside of the working chamber to catalyze the decomposition of the carbon feedstock at an appropriate temperature. Then, the graphene layers can grow on surfaces of the work piece. Another difference between the invention and the prior arts is that the gasiform carrier passes through the liquid container so that the gasiform carrier can carry parts of the catalytic particle solution to form the catalyst. Thus, the large consumption of transition metal is unnecessary, therefore, the high cost problem for manufacturing graphene is solved.

Many other advantages and features of the present invention will be further understood by the following detailed description and the appended drawings.

BRIEF DESCRIPTION OF THE DRAWINGS

Preferred and alternative examples of the present invention are described in detail below with reference to the following drawings.

To facilitate understanding, identical reference numerals have been used, where it is possible to designate identical elements that are common to the figures.

DETAILED DESCRIPTION OF THE INVENTION

The present invention is to provide a graphene manufacturing system for growing graphene layers on a surface of a work piece at a relatively low cost. The present invention is different from the prior arts, which use a metal foil as a catalyst. The present invention utilizes catalytic particles from the outside of the working chamber to catalyze the decomposition of the carbon feedstock. Then, the graphene layers can grow on surfaces of the work piece directly. Low cost, uniform graphene layers, unrestricted size of the work piece and forming graphene layers directly are advantages of this method.

Figure 1A:
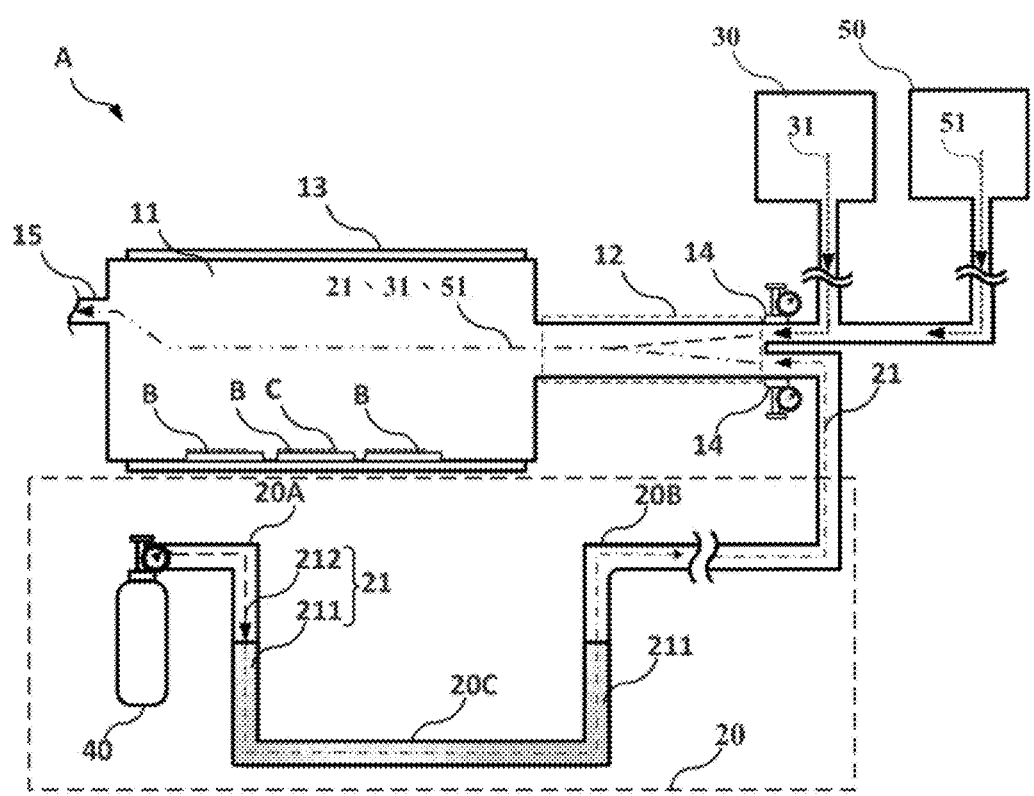
FIG. 1A is a schematic cross-section diagram illustrating a graphene manufacturing system according to an embodiment of the invention.

More specifically, please refer to FIG. 1A. FIG. 1A is a schematic cross-section diagram illustrating a graphene manufacturing system according to an embodiment of the invention. In short, the present invention is used to form a single graphene layer or multiple graphene layers on a work piece B. In minimization, the system A comprises a furnace body 10, a catalyst source 20 and a carbon feedstock source 30. In actual application, the work piece B is set in the working chamber 11 of the furnace body 10, and then the warming is utilized to maintain the working chamber 11 at a high temperature; subsequently, the furnace body 10 is imported gasiform catalyst 21 and gasiform carbon feedstock 31 respectively from the catalyst source 20 and the carbon feedstock source 30. When the gasiform catalyst 21 and the gasiform carbon feedstock 31 are mixed at the top of the working chamber 11, the high temperature will make the gasiform catalyst 21 react with the gasiform carbon feedstock 31 to catalyze the decomposition of carbon feedstock 31 to generate a plurality of carbon atoms. Then, the plurality of carbon atoms will deposit on the surface of the work piece B to form a graphene layer C by a gravitational effect.

After a general description, the following are descriptions for each element respectively. First, as shown in FIG. 1A, the furnace body 10 is a device for chemical vapor deposition (CVD) process, and the composite materials of the furnace body 10 is quartz, ceramic, stainless steel or other heat-resisting materials. The furnace body 10 can further have a warming device 13 to warm the working chamber 11 of the furnace body 10 to a temperature about 1,500 degrees centigrade. Alternatively, the furnace body 10 has a plurality of entry gates 14 and exit gates 15. The entry gates 14 are connected with the catalyst source 20 and the carbon feedstock source 30 to import the gasiform catalyst 21 and the gasiform carbon feedstock 31; and the exit gates 15 are used for exporting the contents of the furnace body 10.

In this embodiment, to enhance the mixing effect between the gasiform catalyst 21 and the gasiform carbon feedstock 31, the entry gates 14 are set on the same side of the furnace body 10 and connected with the catalyst source 20 and the carbon feedstock source 30. The distribution of the entry gates 14 is not limited to this type, but is based on the demand of users. To be noticed, in this embodiment, there can further be a mixing chamber 12 between the entry gates 14 and the working chamber 11. The mixing chamber 12 is used for mixing the carbon feedstock 31 and the catalyst 21 before entering the working chamber. The above mixing chamber 12 is connected with the working chamber 11. In this embodiment, the mixing chamber 12 is a hollow tube and can have an electric heating device to preheat the mixture.

Alternatively, the work piece B is made of SiO2, but not limited to SiO2. Based on the demand of users, the work piece B can be made including, but not limited to silica, quartz, sapphire, glass, NaCl, silicon nitride, alumina or the combinations thereof. Further, the work piece B of the invention can also made of an electric insulating material or other amorphous materials. Besides, the invention can not only form multiple graphene layers but also a single graphene layer by adjusting temperature, concentration and working time. In actual application, a plurality of the work pieces B can be set in the working chamber 11. The arrangement of the work pieces B in the working chamber 11 is not limited in this invention but are based on the demand of users.

The system A of the invention further comprises a catalyst source 20. The catalyst source 20 is connected with the furnace body 10 to provide the furnace body 10 with the catalyst 21. The above catalyst 21 is utilized to react with the carbon feedstock 31 to catalyze the decomposition of the carbon feedstock 31 to generate a plurality of carbon atoms. Unlike the prior arts, which have a metal foil as a surface for deposition, the present invention applies the catalyst source 20 outside of the working chamber 11 to provide the catalyst 21 to react with the carbon feedstock 31.

When entering the working chamber 11, the catalyst 21 is a mixture of a catalytic particle solution 211 and gasiform carrier 212. The catalytic particle solution 211 comprises catalyst metal particles. The gasiform carrier 212 is inert gas.

The following is a description for the above catalyst source 20. In this embodiment, the catalyst source 20 is a series of chamber formed by hollow tubes and has an inlet end 20A, outlet end 20B and a liquid container 20C. In actual application, the catalytic particle solution 211 is set in the liquid container 20C. Then, a gas source 40 inputs the gasiform carrier 212 through the inlet end 20A for making the gasiform carrier 212 pass through the liquid container 20C so that the gasiform carrier 212 can carry parts of the catalytic particle solution 211 out through the outlet end 20B to form the catalyst 21.

Importantly, the above catalytic particle solution 211 consists of 0.05 gram catalytic particles and 300 ml ethanol. The above catalytic particles are Copper(II) acetylacetonate. Unlike the copper foils of the prior arts, the cost of organic copper compound like Copper(II) acetylacetonate is much cheaper. So, the problem of high cost for manufacturing graphene is solved.

The above catalytic particle solution 211 can also consist of 10 grams catalytic particles and 300 ml ethanol. The above catalytic particles are Copper(II) chloride. The Copper(II) chloride powder can also be carried to the chamber by inert gas. Other forms of the catalyst like gasified transition metal are included in the present invention.

However, the catalytic particles of the invention are not limited to the above Copper(II) acetylacetonate. Material like iron, cobalt, nickel, copper, zinc, iridium or the combinations thereof are able to be the catalytic particles of the invention. In addition, the gasiform carrier 212 is inert gas or other gas which cannot react with the catalytic particles and the carbon feedstock 31, like argon (Ar). Importantly, the solution formulation, proportion, volume and category are not limited to the above examples but are based on the demand of users.

Besides the catalyst source 20, the working chamber 11 is further connected with the carbon feedstock source 30. Thus, the gasiform carbon feedstock 31 can be imported to the working chamber 11. Moreover, in actual application, the gasiform carbon feedstock 31 consists of not only carbon atoms but also inert gas as a carrier. Briefly, the gasiform carbon feedstock 31 is a mixture of carbon atoms and inert gas.

Alternatively, the above carbon feedstock is methane, acetylene, ethylene, benzene, CO, $CO_2$ or other materials which have carbon molecule and can be decomposed. Importantly, aside from the above gasiform carbon feedstock, a solid carbon feedstock which can release carbon atoms at high temperature is included in this invention. Further, the above inert gas is argon, helium or other gas which cannot react with the catalytic particles and the carbon atoms.

Besides the above catalyst 21 and carbon feedstock 31, the invention is further connected with a reactive gas source 50. The reactive gas source 50 is connected with the furnace body 10 to provide the working chamber 11 of the furnace body 10 with a reactive gas 51. In this embodiment, the reactive gas 51 is hydrogen.

Figure 1B:
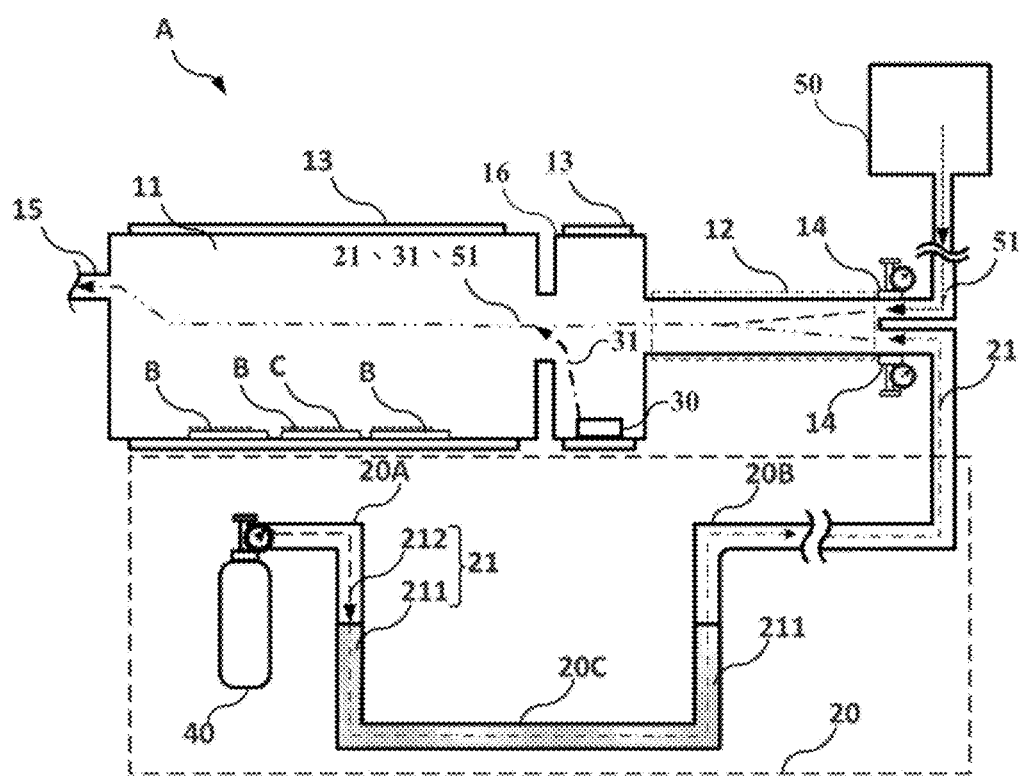
FIG. 1B is a schematic cross-section diagram illustrating a graphene manufacturing system according to an another embodiment of the invention.

Importantly, although the carbon feedstock source 30 is set outside of the furnace body 10 in this embodiment, the carbon feedstock source 30 is not limited to the outside of the furnace body 10. The carbon feedstock source 30 can also be integrated into the furnace body 10, as shown in FIG. 1B. Please refer to FIG. 1B, FIG. 1B is a schematic cross-section diagram illustrating a graphene manufacturing system according to an another embodiment of the invention. In this embodiment, there is a extended chamber 16 between the working chamber 11 and the mixing chamber 12. A carbon feedstock source 30 is set in the extended chamber 16. The carbon feedstock source 30 release the gasiform carbon feedstock 31 by warming a solid carbon feedstock. Furthermore, because the carbon feedstock source 30 is set in the furnace body 10, the inert gas can be reduced even omitted to reduce complexity of this process.

Figure 2:
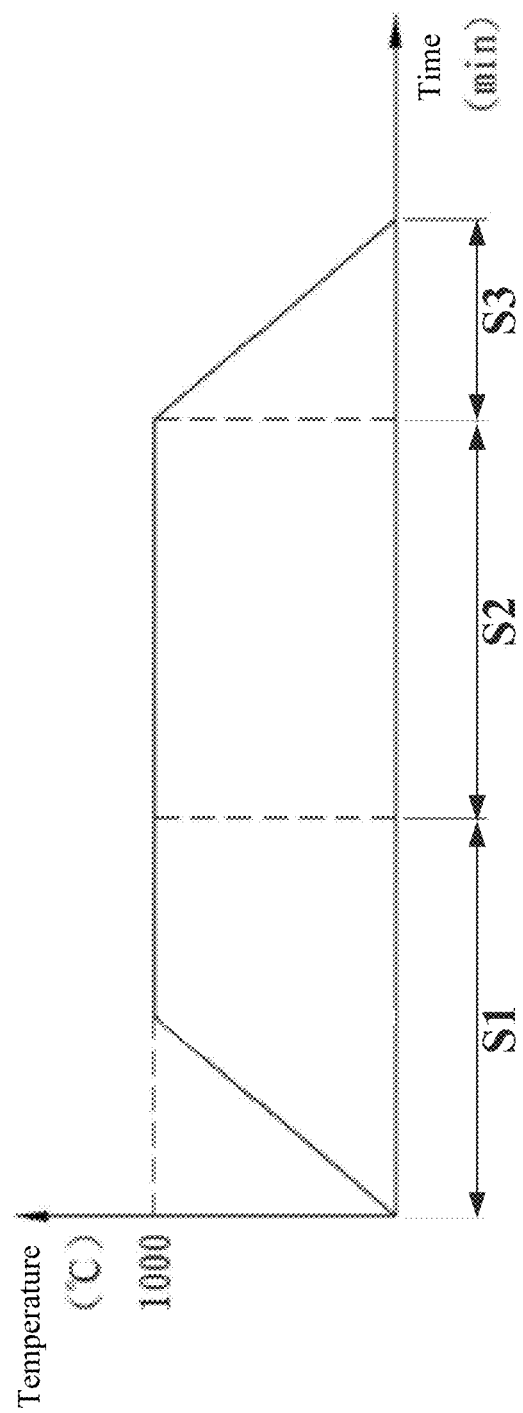
FIG. 2 is a temperature time curve illustrating when the catalyst and the carbon feedstock of the invention enter the working chamber.

After the descriptions for each element, the following is a further description about how to use the system A. Please refer to FIG. 1A again, in actual application, a user or an automatic control system needs to open the entry gates 14 of the furnace body 10 and import the gasiform catalyst 21 as well as the gasiform carbon feedstock 31 respectively from the catalyst source 20 and the carbon feedstock source 30. Please refer to FIG. 2, FIG. 2 is a temperature time curve illustrating when the catalyst and the carbon feedstock of the invention enters the working chamber. The manufacturing process of the system A can be defined to first stage S1, second stage S2, third stage S3. In this embodiment, the first stage S1 is warming. In stage S1, the working chamber 11 is imported with hydrogen at 15 sccm flow rate and argon at 230 sccm flow rate to establish a steady flow field. In the meantime, the working chamber 11 is warmed to a reaction temperature, about 1,000 degrees centigrade in this embodiment. The first stage S1 takes about 60 minutes. Then, the second stage S2 is growing. In the second stage S2, the graphene layers are started to be formed on the surface of the work piece B. At the beginning of stage S2, the working chamber 11 is imported with the carbon feedstock 31 as well as the reactive gas 51 from the carbon feedstock source 30 and the reactive gas source 50, wherein the carbon feedstock 31 is the mixture of argon and CH4 and the reactive gas 51 is hydrogen. The flow rate of hydrogen is 15 sccm, the flow rate of argon is 230 sccm and the flow rate of the carbon feedstock is 10 sccm. In addition, the catalyst 21 is also imported from the catalyst source 20 at 230 sccm flow rate. When the working chamber 11 is at reaction temperature, the gasiform copper atoms will catalyze the decomposition of carbon feedstock 31 to generate a plurality of carbon atoms. Then, the plurality of carbon atoms will deposit on the surface of the work piece B. In this embodiment, the second stage S2 takes about 10 minutes. Importantly, in actual application, the flow rate of the catalyst 21 and the carbon feedstock 31 can be modified. Generally, the working temperature is between 200 degrees and 1,200 degrees centigrade. For example, if the work piece is made of silica, quartz, sapphire or the combinations thereof, the working temperature between 950 degrees and 1,050 degrees centigrade is recommended. However, if the work piece is made of glass, NaCl or the combinations thereof, a working temperature between 600 degrees and 800 degrees centigrade is recommended.

Alternatively, the plurality of carbon atoms will deposit on the surface of the work piece B to form a single graphene layer or multiple graphene layers C. If the concentration of the carbon feedstock 31 is steady, the rate of deposition will be proportional to the flow rate of the carbon feedstock 31.

By this method, the plurality of carbon atoms form the graphene layers directly on the surfaces of the work piece B. Without transference, the character of graphene will not be reduced. In addition, because the chemical vapor deposition (CVD) process is similar to the method in the system A of the invention, the design of the system A can refer to the related design.

After the second stage S2, it is going to the third stage S3, which is used for cooling the working chamber 11. The third stage S3 takes about 10 minutes to maintain the flow field of the stage S1 for cooling and cleaning. The pressure of the working chamber 11 of the furnace body 10 is about 1 atm from the first stage S1 to the third stage S3.

Figure 3A:
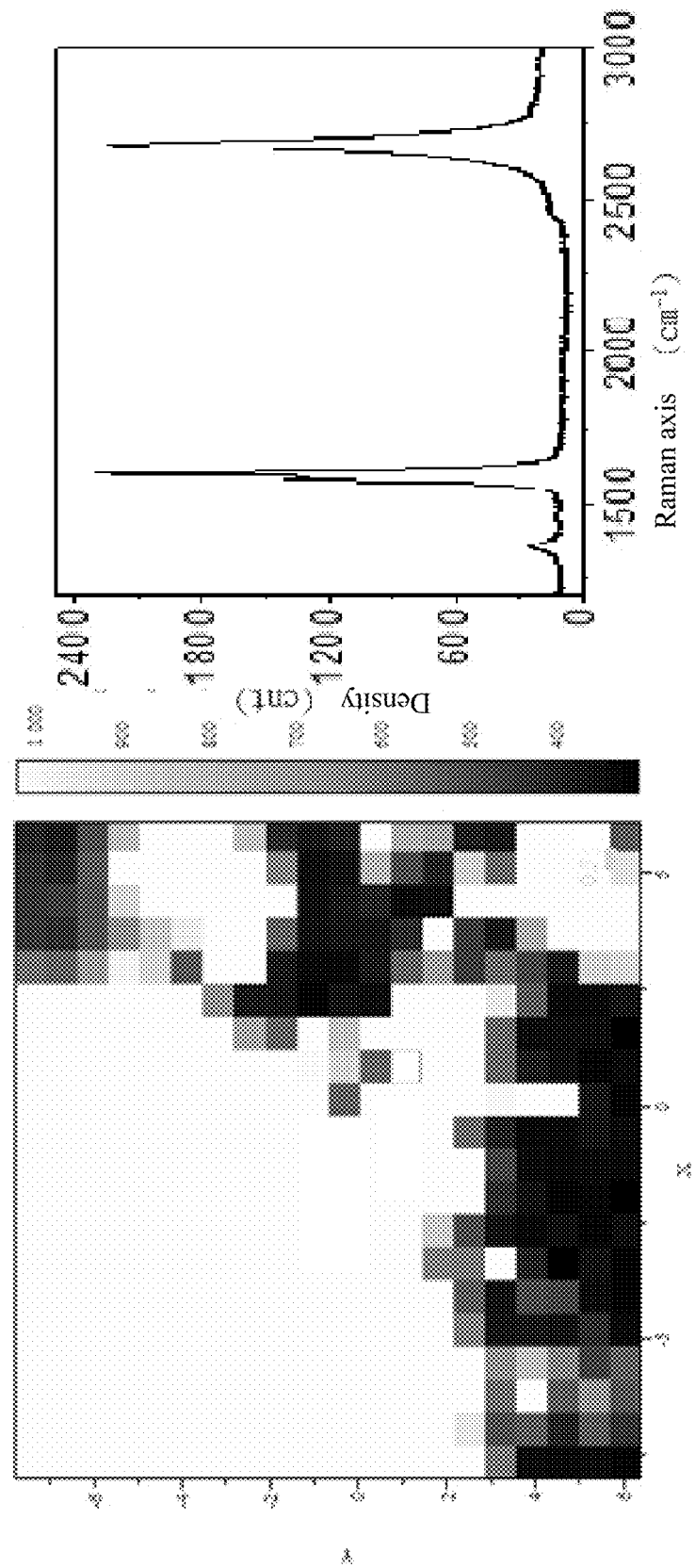
FIG. 3A to FIG. 3C are schematic diagrams illustrating the two-dimensional G peak, 2D peak and D peak of Raman spectrum respectively of the work piece after processing.
Figures 3B, 3C:
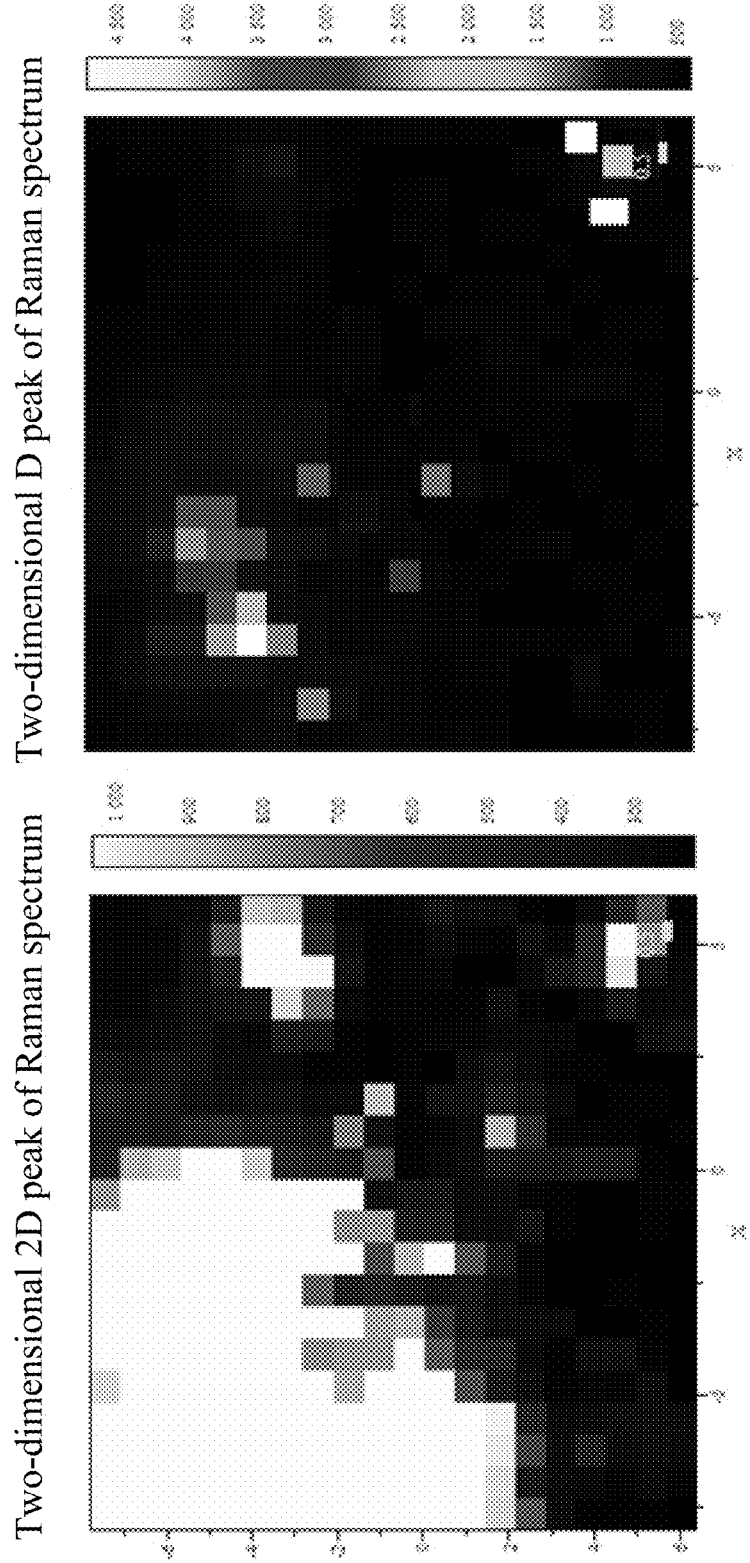

What deserves to be mentioned is that the work piece B has a choice to have a plasma treatment to clean surfaces of the work piece B and further improve the quality of the graphene layers. The plasma treatment is performed by a plasma having oxygen. Please refer to FIG. 3A to FIG. 3C. FIG. 3A to FIG. 3C are schematic diagrams illustrating the two-dimensional G peak, 2D peak and D peak of Raman spectrum respectively of the work piece after process. The above diagrams are analyzed by using a laser with 523 nm wavelength to through a Raman spectrometer with 1 cm-1 dpi. Further, the strength of the incident laser is 10 mW and the area of the laser spot is about 1.5×1.5 μm2. The D peak of Raman spectrum represents the vibration frequency generated from crystal defect of the graphene layers. Thus, the bigger the D peak of Raman spectrum is, the more crystal defects there are. Additionally, 2D peak of Raman spectrum represents the crystallinity of the graphene layers. Further, two-dimensional G peak of Raman spectrum represents the uniformity of the graphene layers. In short, the above three diagrams show the good quality of the graphene layers on the work piece B of the invention.

Figures 4A, 4B:
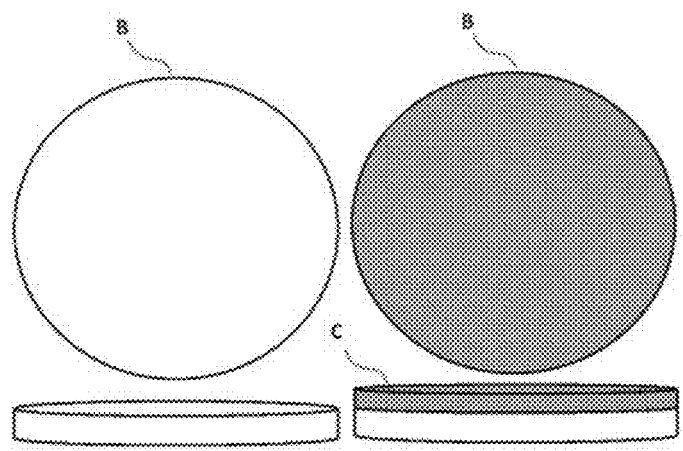
FIG. 4A and FIG. 4B are top view and side view illustrating graphene layers on a silicon wafer according to the invention.
Figures 5A, 5B:
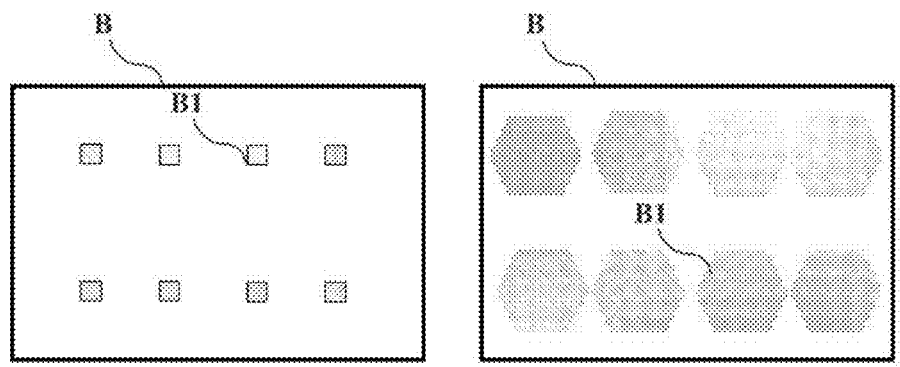
FIG. 5A and FIG. 5B are schematic diagrams illustrating seeds distribution on a work piece according to the invention.

In addition, the system and method for manufacturing graphene of the present invention can be applied in semiconductor wafer manufacturing process to form a uniform graphene layer C on a surface of wafer. As shown in FIG. 4A and FIG. 4B, the above graphene layer C is a single graphene layer. Further, a seed B1 can be configured on a surface of the work piece B to have a better graphene layer, as shown in FIG. 5A and FIG. 5B. Importantly, the seed B1 is used for improving the quality but not necessary in this invention.

The present invention is to provide a system and a method for manufacturing graphene. The present invention is different from the prior arts, which use a metal foil as a catalyst. The present invention utilizes catalytic particles from the outside of the working chamber to catalyze the decomposition of the carbon feedstock at a proper temperature. Then, the graphene layers can grow on surfaces of the work piece. Another difference between the invention and the prior arts is that the gasiform carrier passes through the liquid container so that the gasiform carrier can carry parts of the catalytic particle solution to form the catalyst. Thus, the big consumption of transition metal is unnecessary, thus, the high cost problem for manufacturing graphene is solved.

With the example and explanations above, the features and spirits of the invention will be hopefully well described. Importantly, the present invention is not limited to the embodiment described herein. Those skilled in the art will readily observe that numerous modifications and alterations of the device may be made while retaining the teaching of the invention. Accordingly, the above disclosure should be construed as limited only by the metes and bounds of the appended.

The embodiments of the invention in which an exclusive property or privilege is claimed are defined as follows:

1. A method for manufacturing graphene, applied to grow graphene layers on an insulated surface of a work piece, comprising the following steps of:
    preparing the work piece;
    preparing a catalyst having a gasiform transition metal element;
    preparing a carbon feedstock;
    preparing hydrogen;
    mixing the carbon feedstock, the hydrogen and the catalyst over the work piece, the flow rate of the catalyst is between 4 sccm and 1,200 sccm; and
    warming the carbon feedstock, the hydrogen and the catalyst to the temperature between 200 degrees and 1,200 degrees centigrade, and maintaining the pressure inside the chamber between 1 mTorr and 800 Torr to make the catalyst react with the carbon feedstock and the hydrogen so as to catalyze the decomposition of carbon feedstock to generate a plurality of carbon atoms, and the plurality of carbon atoms form the graphene layers directly on the insulated surface of the work piece.

2. The method for manufacturing graphene of claim 1, wherein the step of preparing a catalyst further comprises the following substeps:
    preparing a catalytic particle solution comprising a transition metal element;
    preparing a gasiform carrier; and
    making the gasiform carrier pass through the catalytic particle solution and carry parts of the catalytic particle solution to form the catalyst.

3. A method for manufacturing graphene, applied to grow at least one graphene layer on an insulated surface of a work piece, comprising the following steps of:
    loading the work piece into a working chamber;
    introducing a catalyst comprises transition metal elements;
    introducing a carbon feedstock;
    introducing hydrogen;
    mixing the carbon feedstock, the hydrogen, and the catalyst over the work piece;
    heating the work piece to a growth temperature and maintaining the pressure inside the chamber between 1 mTorr and 800 Torr to make the catalyst reacting with the hydrogen and the carbon feedstock so as to catalyze the decomposition of carbon feedstock to generate a plurality of carbon atoms, and the plurality of carbon atoms form graphene layers directly on the insulated surface of the work piece;
    wherein the catalyst comprises a gasiform carrier and a catalytic particle solution comprising the transition metal elements; the working chamber is connected to a catalyst source comprising an inlet end, an outlet end and a liquid container; the inlet end is connected with a gas source; the liquid container is configured between the inlet end and the outlet end for containing the catalytic particle solution; the outlet end is connected with the working chamber; the gas source inputs the gasiform carrier through the inlet end for making the gasiform carrier pass through the liquid container so that the gasiform carrier can carry parts of the catalytic particle solution to form the catalyst.

4. The method for manufacturing graphene of claim 3, wherein the gasiform carrier is argon or helium.

5. The method for manufacturing graphene of claim 3, wherein the transition metal elements are iron, cobalt, nickel, copper, zinc or iridium.

6. The method for manufacturing graphene of claim 3, wherein the carbon feedstock comprises one of the following: methane, acetylene, ethylene, benzene, carbon monoxide and carbon dioxide.

7. The method for manufacturing graphene of claim 3, wherein the work piece is made of silica, quartz, sapphire, glass, sodium chloride, silicon nitride, alumina or the combinations thereof.

8. The method for manufacturing graphene of claim 3, wherein the working chamber further comprises a mixing chamber, the mixing chamber is configured among a catalyst source, a hydrogen source, a carbon feedstock source and the working chamber, the mixing chamber is used for mixing the carbon feedstock, the hydrogen and the catalyst before entering the reaction chamber.

9. The method for manufacturing graphene of claim 3, wherein the work piece can be processed in advance by a plasma treatment; the plasma treatment is performed by a plasma having oxygen or argon.

10. The method for manufacturing graphene of claim 3, wherein carbon seeds can be configured on the insulated surface of the work piece.

11. The method for manufacturing graphene of claim 3, wherein the growth temperature is between 200° C. and 1,200° C.

12. The method for manufacturing graphene of claim 3, wherein the at least one graphene layers are monolayer graphene films, multilayer graphene films, or combination thereof.

* * * * *